United States Patent
Kim et al.

(10) Patent No.: US 10,725,351 B2
(45) Date of Patent: Jul. 28, 2020

(54) DISPLAY APPARATUS AND METHOD OF MANUFACTURING THE SAME

(71) Applicant: Samsung Display Co., Ltd., Yongin-si (KR)

(72) Inventors: Minseok Kim, Cheongju-si (KR); Jonghwan Kim, Busan (KR); Youngmin Cho, Seongnam-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/287,930

(22) Filed: Feb. 27, 2019

(65) Prior Publication Data

US 2019/0204653 A1 Jul. 4, 2019

Related U.S. Application Data

(62) Division of application No. 15/629,660, filed on Jun. 21, 2017, now Pat. No. 10,254,603.

(30) Foreign Application Priority Data

Dec. 16, 2016 (KR) .......................... 10-2016-0172868

(51) Int. Cl.
*G02F 1/1345* (2006.01)
*G02F 1/1368* (2006.01)
(Continued)

(52) U.S. Cl.
CPC ........ *G02F 1/13452* (2013.01); *G02F 1/1368* (2013.01); *H01L 24/27* (2013.01);
(Continued)

(58) Field of Classification Search
CPC .................................................. G02F 1/13452
See application file for complete search history.

(56) References Cited

U.S. PATENT DOCUMENTS

2016/0203787 A1* 7/2016 Park ........................ G09G 5/00
345/206
2018/0061367 A1* 3/2018 Ye ........................ G09G 3/3406

FOREIGN PATENT DOCUMENTS

KR         10-1422746      7/2014
KR     10-2014-0115044     9/2014
(Continued)

OTHER PUBLICATIONS

Notice of Allowance dated Nov. 23, 2018 issued in U.S. Appl. No. 15/629,660.

*Primary Examiner* — Edmond C Lau
(74) *Attorney, Agent, or Firm* — H.C. Park & Associates, PLC

(57) ABSTRACT

A display apparatus includes a display panel including a lower base substrate and a connecting portion disposed on the lower base substrate, a flexible circuit board attached on a side surface of the display panel, and including a base film and a conductive pattern disposed on the base film, a conductive paste part disposed between the side surface of the display panel and the flexible circuit board, a first anisotropic conductive film (ACF) film disposed between the side surface of the display panel and the conductive paste part, and a second ACF film disposed between the conductive paste part and the flexible circuit board. The connecting portion is exposed at the side surface of the display panel, and the first ACF film directly makes contact with the connecting portion.

3 Claims, 19 Drawing Sheets

(51) Int. Cl.
  *H01L 51/00*  (2006.01)
  *H01L 27/32*  (2006.01)
  *H01L 23/00*  (2006.01)
  *H05K 1/14*  (2006.01)
  *H05K 3/32*  (2006.01)
  *H05K 3/36*  (2006.01)

(52) U.S. Cl.
  CPC .......... *H01L 24/32* (2013.01); *H01L 27/3276* (2013.01); *H01L 51/0096* (2013.01); *H05K 1/147* (2013.01); *H05K 3/323* (2013.01); *H05K 3/361* (2013.01); *H01L 2224/27312* (2013.01); *H05K 2201/10136* (2013.01); *Y02E 10/549* (2013.01)

(56) References Cited

FOREIGN PATENT DOCUMENTS

| | | |
|---|---|---|
| KR | 10-2014-0115045 | 9/2014 |
| KR | 10-2014-0136233 | 11/2014 |
| KR | 10-2015-0072743 | 6/2015 |
| KR | 10-2015-0074275 | 7/2015 |

* cited by examiner

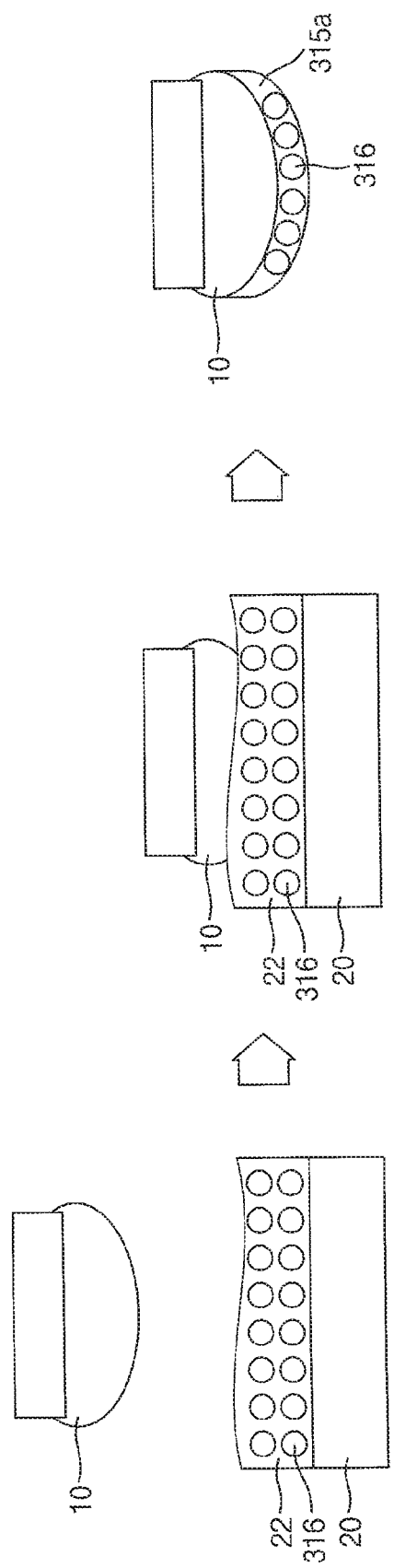

DISPLAY APPARATUS AND METHOD OF MANUFACTURING THE SAME

CROSS-REFERENCE TO RELATED APPLICATION

This application is a divisional of U.S. application Ser. No. 15/629,660, filed on Jun. 21, 2017, and claims priority from and the benefit of Korean Patent Application No. 10-2016-0172868, filed on Dec. 16, 2016, which are hereby incorporated by reference for all purposes as if fully set forth herein.

BACKGROUND

Field

Exemplary embodiments relate to a display apparatus and a method of manufacturing the display apparatus. More particularly, exemplary embodiments relate to a display apparatus implementing a slim bezel.

Discussion of the Background

Recently, a flat panel display apparatus has been manufactured due to having light weight and small size. The formerly-used cathode ray tube (CRT) display apparatus had been used due to its performance and competitive price. However, the CRT display apparatus has lost favor due to its size and weight. Therefore a flat panel display apparatus such as a plasma display apparatus, a liquid crystal display apparatus, and an organic light emitting display apparatus has been highly regarded due to small size, light weight, and low-power-consumption.

The flat panel display apparatus includes a display area in which an image is displayed, and a peripheral area (bezel) which surrounds the display area and is a non-display area. Various driving circuits and wires for displaying the image on the display area may be disposed in the bezel. Here, a width of the bezel is increased by the driving circuit and the wirings, and design of the entire display apparatus is lowered.

The above information disclosed in this Background section is only for enhancement of understanding of the background of the inventive concepts, and, therefore, it may contain information that does not form the prior art that is already known in this country to a person of ordinary skill in the art.

SUMMARY

Exemplary embodiments provide a display apparatus with reduced bezel width capable of improving electrical contact.

Exemplary embodiments provide a method of manufacturing the display apparatus.

Additional aspects will be set forth in the detailed description which follows, and, in part, will be apparent from the disclosure, or may be learned by practice of the inventive concepts.

According to exemplary embodiments, a display apparatus includes a display panel including a lower base substrate and a connecting portion disposed on the lower base substrate, a flexible circuit board attached on a side surface of the display panel, and including a base film and a conductive pattern disposed on the base film, a conductive paste part disposed between the side surface of the display panel and the flexible circuit board, a first anisotropic conductive film (ACF) film disposed between the side surface of the display panel and the conductive paste part, and a second ACF film disposed between the conductive paste part and the flexible circuit board. The connecting portion is exposed at the side surface of the display panel, and the first ACF film directly makes contact with the connecting portion.

According to exemplary embodiments, the first ACF film may be a non-random array anisotropic conductive film.

According to exemplary embodiments, the first ACF film may include a resin film and a plurality of conductive balls which are arranged in a matrix form in one layer in the resin film.

According to exemplary embodiments, a thickness of the resin film of the first ACF film may be equal to or smaller than a diameter of the conductive ball.

According to exemplary embodiments, the display panel may display an image on a plane formed by a first direction and a second direction which is perpendicular to the first direction. The conductive balls of the first ACF film may be arranged in the matrix form in the second direction and a third direction. The second direction may be an extension direction of the side surface of the display panel, and the third direction which is perpendicular to the second direction and is a thickness direction of the display panel.

According to exemplary embodiments, the conductive balls of the first ACF film may be arranged in the matrix form in the second direction and in an inclined direction which is inclined with respect to the third direction by a predetermined angle.

According to exemplary embodiments, the second ACF film may be an anisotropic conductive film having a plurality of conductive balls randomly arranged in a resin film.

According to exemplary embodiments, the connecting part may include a plurality of connecting lines. The connecting lines may be spaced apart from each other in an extending direction of the side surface of the display panel. End of the connecting line may be exposed at the side surface of the display panel, and the end of the connecting line makes contact with the first ACF film.

According to exemplary embodiments, the conductive paste part may include a plurality of conductive paste lines corresponding to each of the connecting lines. The conductive paste lines may be spaced apart from each other in an extension direction of the side surface of the display panel. The conductive pattern of the flexible circuit board may be formed corresponding to the conductive paste lines.

According to exemplary embodiments, the flexible circuit board may include a driving circuit part mounted on the base film and electrically connected to the conductive pattern. A signal generated from the driving circuit part may be provided to the display panel through the conductive pattern, the second ACF film, the conductive pate part, the first ACF film and the connecting portion.

According to exemplary embodiments, the display panel may further include an upper base substrate facing the lower base substrate, and a liquid crystal disposed between the upper base substrate and the lower base substrate. The display panel may further include sealing member disposed between the upper base substrate and the lower base substrate to seal the liquid crystal layer. The first ACF film may make contact with the lower base substrate, the sealing member and the upper base substrate.

According to exemplary embodiments, the display panel may further include an upper base substrate facing the lower base substrate, and a liquid crystal or an organic light emitting structure disposed between the upper base substrate and the lower base substrate. The first ACF film may make contact with the lower base substrate and the upper base substrate.

According to exemplary embodiments, the display panel may further include a cover layer on the lower base substrate. The first ACF film may make contact with the lower base substrate and the cover layer.

According to exemplary embodiments, a display panel includes a display panel including a lower base substrate and a connecting portion disposed on the lower base substrate, a flexible circuit board attached on a side surface of the display panel, and including a base film and a conductive pattern disposed on the base film, a conductive paste part disposed between the side surface of the display panel and the flexible circuit board, and an ACF film disposed between the conductive paste part and the flexible circuit board. The connecting portion is exposed at the side surface of the display panel, and the conductive paste part directly makes contact with the connecting portion.

According to exemplary embodiments, the conductive ball may have a polymer particle, and metal is coated on a surface of the polymer particle.

According to exemplary embodiments, the conductive ball may be a solder ball. When the conductive paste part is attached on the side surface of the display panel, the solder ball may be soldered to the connecting part by heat.

According to exemplary embodiments, a method of manufacturing a display apparatus includes providing a display panel including a connecting part, wherein the connecting part is exposed at a side surface of the display panel, attaching a first ACF film on the side surface of the side surface of the display panel, forming a conductive paste part on the first ACF film, attaching a second ACF film on the conductive paste part, and attaching a flexible circuit board on the second ACF film.

According to exemplary embodiments, the first ACF film may include a resin film and a plurality of conductive balls which are arranged in a matrix form in one layer in the resin film.

According to exemplary embodiments, forming the conductive paste part may include coating a conductive paste on the first ACF film, and forming a plurality of conductive paste lines spaced apart from each other in an extension direction of the side surface of the display panel by patterning the conductive paste.

According to exemplary embodiments, in forming the conductive paste part, a plurality of conductive paste lines spaced apart from each other in an extension direction of the side surface of the display panel may be formed using inkjet method on the first ACF film.

According to exemplary embodiments, the connecting part may include a plurality of connecting lines. The connecting lines may be spaced apart from each other in an extending direction of the side surface of the display panel. End of the connecting line may be exposed at the side surface of the display panel, and the end of the connecting line makes contact with the first ACF film. The conductive paste part may include a plurality of conductive paste lines corresponding to each of the connecting lines. The conductive paste lines may be spaced apart from each other in an extension direction of the side surface of the display panel. The flexible circuit board may include a base film and a conductive pattern formed on the base film. The conductive pattern may be formed corresponding to the conductive paste lines.

According to exemplary embodiments, a display apparatus includes a display panel and a flexible circuit board on a side surface of the display panel including a driving circuit part for driving the display apparatus. The flexible circuit board is attached on the side surface using a first ACF film, a conductive paste part, and a second ACF film. Thus, display apparatus having a slim bezel which is non-display region can be implemented. In addition, the flexible circuit board is attached using the first ACF film, the conductive paste part, and the second ACF film, so that electrical contact failure can be prevented.

According to exemplary embodiments, when the conductive balls are arranged obliquely, electrical contact characteristics between the conductive balls and the connection portion may not be deteriorated even if alignment of the first ACF film and the connection portion is somewhat inappropriate.

According to exemplary embodiments, the display apparatus may further include a plurality of conductive balls or solder balls, so that the flexible circuit board can be firmly attached on the side surface of the display panel without any problem of electrical contact failure.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concepts, and are incorporated in and constitute a part of this specification, illustrate exemplary embodiments of the inventive concepts, and, together with the description, serve to explain principles of the inventive concepts.

FIG. 13C is from the view of the conductive paste part to a direction that is opposite to the direction D1, without illustrating intervening elements.

FIG. 15A, FIG. 15B, FIG. 15C, FIG. 15D, FIG. 15E, and FIG. 15F are cross-sectional views and side views of a peripheral region of the display apparatus of FIG. 1.

DETAILED DESCRIPTION OF THE ILLUSTRATED EMBODIMENTS

Figure 1:
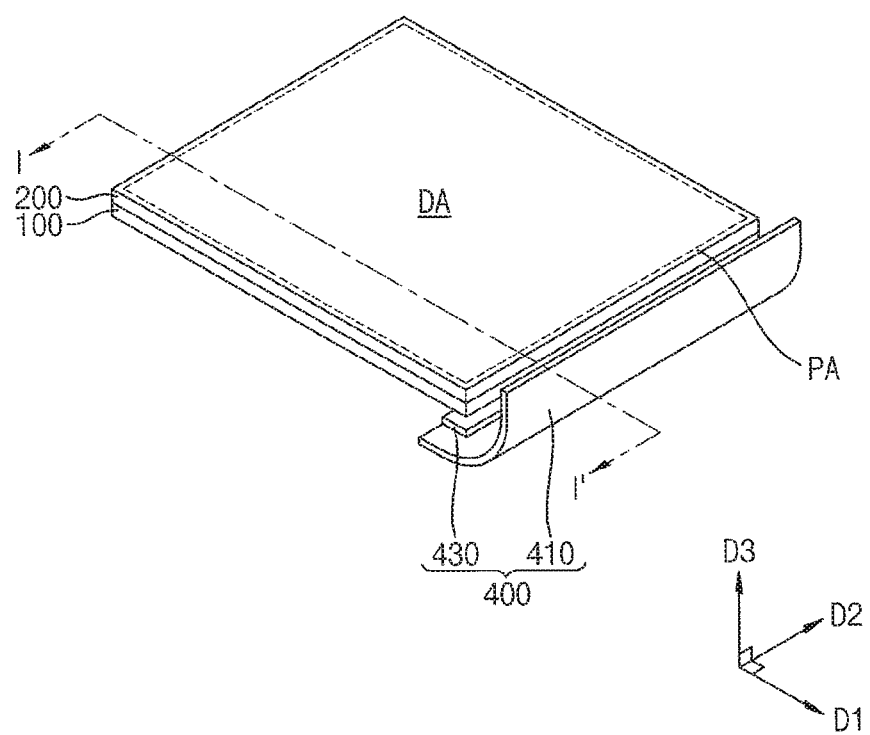
FIG. 1 is a perspective view illustrating a display apparatus according to an exemplary embodiment.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. As such, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Hereinafter, the inventive concept will be explained in detail with reference to the accompanying drawings.

FIG. 1 is a perspective view illustrating a display apparatus according to an exemplary embodiment.

Referring to FIG. 1, the display apparatus may include a display panel and a flexible circuit board 400 attached on a side surface of the display panel. The display panel may include a lower substrate 100 and an upper substrate 200. The flexible circuit board 400 may include a base film 410 and a driving circuit part 430 disposed on the base film 410.

An image may be displayed in a display region DA of the upper substrate 200 of the display panel. The display panel may display the image on a plane formed by a first direction D1 and a second direction D2 which is perpendicular to the first direction D1 in the display region DA. A peripheral region PA which surrounds the display region DA is a non-display region. Thus, the peripheral region PA may be corresponding to a bezel of the display apparatus.

The flexible circuit board 400 may be attached on a side surface of the display panel. Thus, the flexible circuit board 400 may be attached on the side surfaces of the lower substrate 100 and the upper substrate 200, so that a bezel width in which the image is not displayed may be minimized. The flexible circuit board 400 may extend in a third direction D3 which is perpendicular to the first and second directions D1 and D2, and bend toward a rear surface of the display panel, so that the driving circuit part 430 may be parallel to the lower and upper substrates 100 and 200.

The driving circuit part 430 may generate a signal for driving the display panel of the display apparatus. The driving circuit part 430 may be electrically connected to the display panel through a conductive pattern (see, e.g., 420 of FIG. 2) of the flexible circuit board 400. For example, the driving circuit part 430 may be an integrated circuit (IC) mounted on the base film 410.

Figure 2:
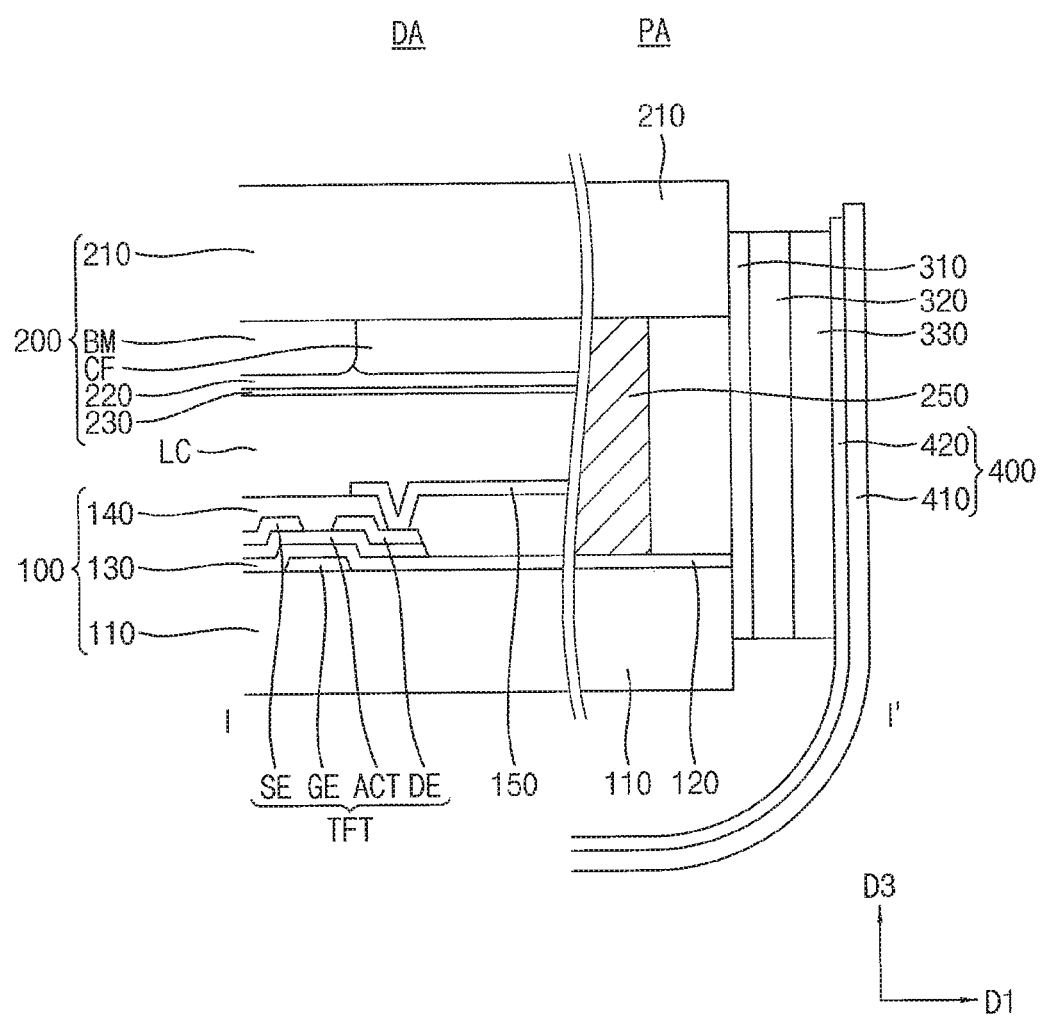
FIG. 2 is a cross-sectional view taken along a line I-I' of FIG. 1.
Figure 3:
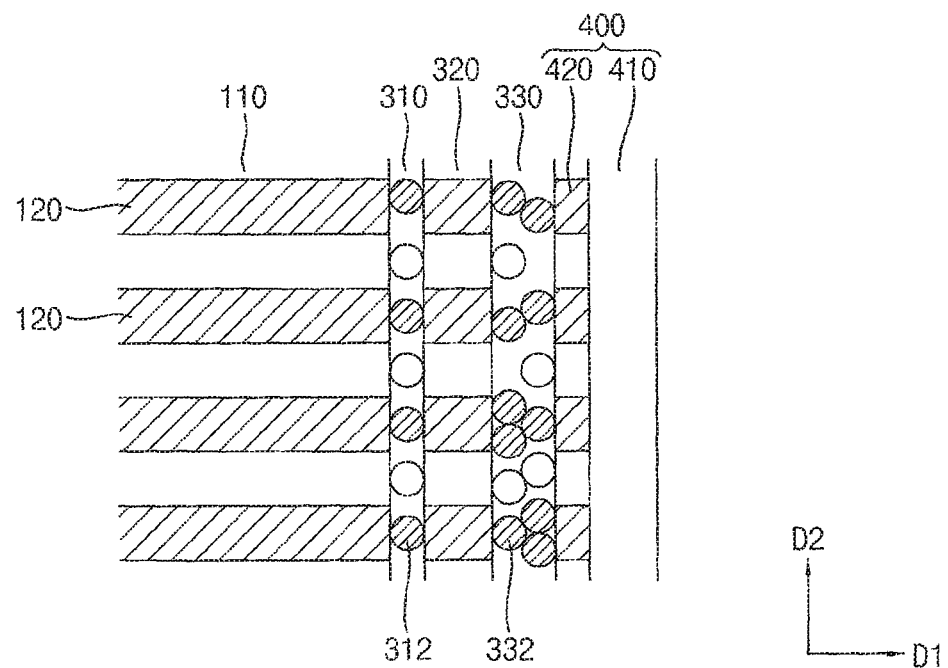
FIG. 3 is a partially enlarged cross-sectional view of a portion of the display apparatus of FIG. 1 where a bonded portion of a flexible circuit board and a display panel is cut off in a plane parallel to the display panel.
Figure 4A:
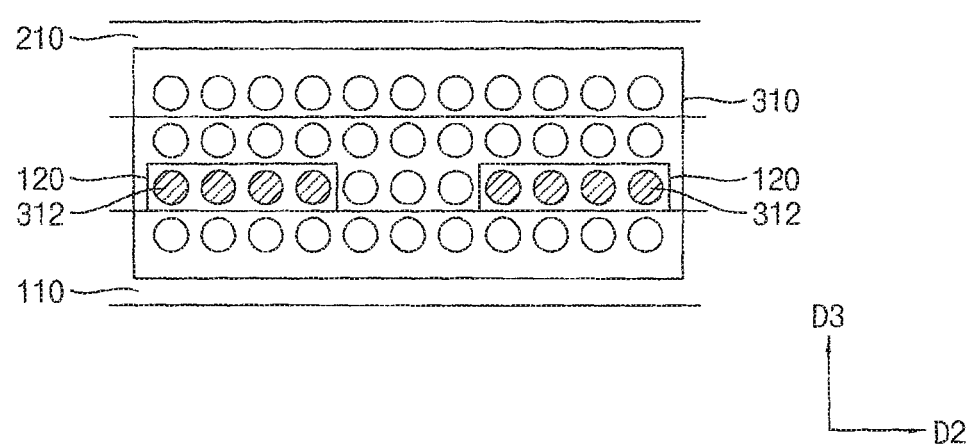
FIG. 4A is a side view illustrating a first ACF film of the display apparatus of FIG. 1, from the view of the first ACF film to a direction that is opposite to the direction D1, without illustrating intervening elements.
Figure 4B:
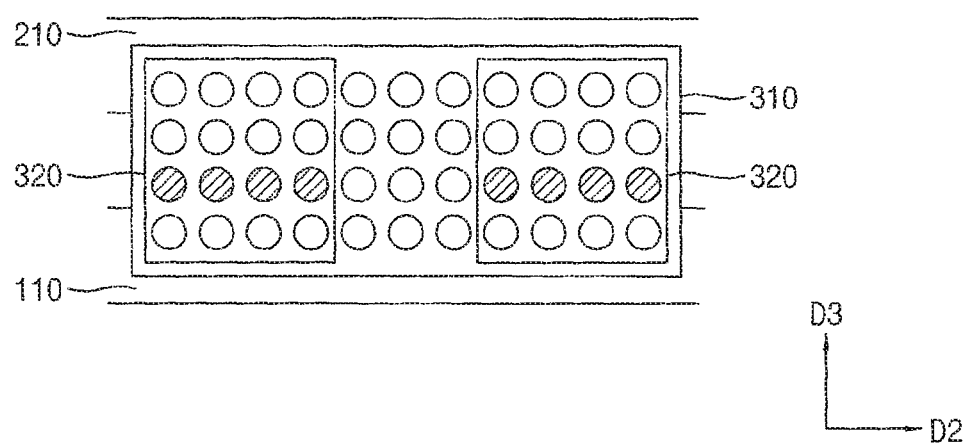
FIG. 4B is a side view illustrating a conductive paste part of the display apparatus of FIG. 1, from the view of the first ACF film to a direction that is opposite to the direction D1, without illustrating intervening elements.
Figure 4C:
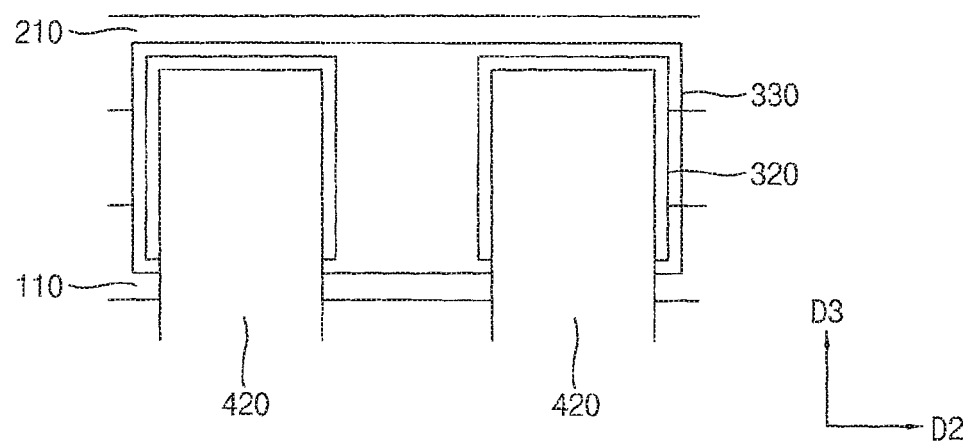
FIG. 4C is a side view illustrating a conductive pattern of the flexible circuit board of the display apparatus of FIG. 1.

FIG. 2 is a cross-sectional view taken along a line I-I' of FIG. 1. FIG. 3 is a partially enlarged cross-sectional view of a portion of the display apparatus of FIG. 1 where a bonded portion of a flexible circuit board and a display panel is cut off in a plane parallel to the display panel. FIG. 4A is a side view illustrating a first ACF film of the display apparatus of FIG. 1. FIG. 4B is a side view illustrating a conductive paste part of the display apparatus of FIG. 1. FIG. 4C is a side view illustrating a conductive pattern of the flexible circuit board of the display apparatus of FIG. 1.

Referring to FIGS. 1 to 4C, the display apparatus may include a lower substrate 100, an upper substrate 200, and a liquid crystal layer LC between the lower substrate 100, the upper substrate 200. The lower substrate 100 may include a lower base substrate 110, a gate pattern, a first insulation layer 130, an active pattern ACT, a data pattern, a second insulation layer 140, and a pixel electrode 150 in a display region DA. The upper substrate 200 may include an upper base substrate 210, a black matrix BM, a color filter CF, an over-coating layer 220, and a common electrode 230 in the display region DA.

The lower base substrate 110 may include a transparent insulation substrate. For example, the lower base substrate 110 may include a glass substrate, a quartz substrate, a transparent resin substrate, etc. Examples of the transparent resin substrate for the lower base substrate 110 may include polyimide-based resin, acryl-based resin, polyacrylate-based resin, polycarbonate-based resin, polyether-based resin, sulfonic acid containing resin, and polyethyleneterephthalate-based resin, but exemplary embodiments are not limited thereto.

The gate pattern may be disposed on the lower base substrate 110. The gate pattern may include metal, alloy, conductive metal oxide, a transparent conductive material, etc. The gate pattern may include a gate electrode GE, a connecting portion 120, and a signal line for driving the display apparatus.

The first insulation layer 130 may be disposed on the lower base substrate 110 on which the gate pattern is formed. The first insulation layer 130 may include inorganic insulation material. For example, the first insulation layer 130 may insulate the gate pattern and be formed using silicon oxide, metal oxide, etc.

The active pattern ACT may be disposed on the first insulation layer 130. The active pattern ACT may include a semiconductor layer consisting of amorphous silicon (a-Si: H) and an ohmic contact layer consisting of n+ amorphous silicon (n+a-Si:H). In addition, the active pattern ACT may include an oxide semiconductor. The oxide semiconductor may include an amorphous oxide including at least one selected from the group consisting of indium (In), zinc (Zn), gallium (Ga), tin (Sn) and hafnium (Hf). The active pattern ACT may include source and drain area which is impurity-doped area, and a channel area between the source area and the drain area.

The data pattern may be disposed on the active pattern ACT and the first insulation layer 130. The data pattern may include metal, alloy, conductive metal oxide, a transparent conductive material, etc. The data pattern may include a source electrode SE, a drain electrode DE, and a signal line for driving the display apparatus.

The gate electrode GE, the active pattern ACT, the source electrode SE and the drain electrode DE may be included in a thin film transistor TFT.

The second insulation layer 140 may be disposed on the active pattern ACT, the data pattern and the first insulation layer 130. The second insulation layer 140 may include inorganic or organic insulation material. For example, the second insulation layer 140 may include photoresist, acryl-based resin, polyimide-based resin, polyamide-based resin, siloxane-based resin, etc.

In some exemplary embodiments, the second insulation layer 140 may have a relatively large thickness for sufficiently covering the active pattern ACT, so that the second insulation layer 140 may have a substantially level surface. In some exemplary embodiments, the second insulation layer 140 may be uniformly formed on the first insulation layer 130 along a profile of the active pattern ACT and the data pattern.

The pixel electrode 150 may be disposed on the second insulation layer 140. The pixel electrode 150 may be electrically connected to the drain electrode DE of the thin film transistor TFT through a contact hole formed through the second insulation layer 140. The pixel electrode 150 may include transparent conductive material. For example, the pixel electrode 150 may include indium tin oxide (ITO), indium zinc oxide (IZO) and etc.

The upper base substrate 210 may be disposed to face the lower base substrate 110. The upper base substrate 210 may include a transparent insulation substrate. For example, the upper base substrate 210 may include a glass substrate, a quartz substrate, a transparent resin substrate, etc. Examples of the transparent resin substrate for the upper base substrate 210 may include polyimide-based resin, acryl-based resin, polyacrylate-based resin, polycarbonate-based resin, polyether-based resin, sulfonic acid containing resin, and polyethyleneterephthalate-based resin, but exemplary embodiments are not limited thereto.

The black matrix BM may be disposed on the upper base substrate 210. The black matrix BM may include a material which blocks light. The black matrix BM may overlap the thin film transistor TFT.

The color filter CF may be disposed on the upper base substrate 210 on which the black matrix BM is disposed. The color filter CF supplies colors to the light passing through the liquid crystal layer LC. The color filter CF may include a red color filter, a green color filter and blue color filter. The color filter CF corresponds to a pixel. The color filters adjacent to each other may have different colors. The color filter CF may be overlapped with adjacent color filter in a boundary of the adjacent pixels. In addition, the color filter CF may be spaced apart from adjacent color filter in the boundary of the adjacent pixels.

The over-coating layer 220 may be disposed under the color filter CF and the black matrix BM. The over-coating layer 220 may flatten, protects, and insulates the color filter CF. The over-coating layer 220 may include acrylic-epoxy material.

The common electrode 230 may be disposed under the over-coating layer 220. The common electrode 230 may be disposed to face the pixel electrode 150. The common electrode 230 may include transparent conductive material. For exemplary, the common electrode 230 may include indium tin oxide (ITO), indium zinc oxide (IZO), etc.

The liquid crystal layer LC may include liquid crystal molecules having optical anisotropy. The liquid crystal molecules are driven by electric field, so that an image is displayed by passing or blocking light through the liquid crystal layer LC. The liquid crystal layer LC may be sealed by a sealing member 250 disposed between the lower base substrate 110 and the upper base substrate 210 in the peripheral region PA.

The display apparatus may include the lower base substrate 110, the connecting portion 120 disposed on the lower base substrate 110 and the upper base substrate 210.

Referring to FIG. 3, the connecting portion 120 may include a plurality of connecting lines. Ends of the connecting lines may be exposed at the side surface of the display panel. The connecting lines may be spaced apart from each other in the second direction D2. Thus, the connecting lines may be arranged along the side surfaces of the display panel with being spaced apart from each other.

Each of the connecting lines may be electrically connected to a driving circuit part 430 through a conductive ball 312 of a first ACF film 310, a conductive paste line, a conductive ball 332 of a second ACF film 330, and a conductive pattern 420. Thus, a plurality of electrical signals for driving the display apparatus may be applied to the plurality of connecting lines, respectively.

The first ACF film 310, a conductive paste part 320, the second ACF film 330, and the flexible circuit board 400 may be disposed in order on a side surface of the lower base substrate 110 and a side surface of the upper base substrate 210. The flexible circuit board 400 may include a base film 410 and a conductive pattern 420 disposed on the base film 410.

The first ACF film 310 may be an anisotropic conductive film. Thus, the first ACF film 310 may have a structure including a resin film in which a plurality of conductive balls 312 are disposed. The conductive ball 312 may have a structure that metal particles such as nickel (Ni) and gold (Au) are coated on a surface of a polymer particle. The resin film may include thermosetting resin or thermoplastic resin.

Preferably, the first ACF film 310 may be a non-random array anisotropic conductive film. For example, the first ACF film 310 may have a structure including a resin film having adhesive in which a plurality of conductive balls 312 are arranged in one layer (see FIG. 3). Here, the conductive balls 312 may be arranged in a matrix form in a plane formed by a second direction D2 and a third direction D3 at regular interval (see FIG. 4A). Here, a thickness of the resin film of the first ACF film 310 may be preferably same as or smaller than a diameter of the conductive balls 312. Each conductive ball 312 has a structure wherein metal particles are coated on a surface of a polymer particle, so that the conductive ball 312 has elasticity. Thus, although the thickness of the resin film of the first ACF film 310 is equal to or smaller than the diameter of the conductive ball 312, the resin film may be attached to the side surface of the display panel and the conductive paste part 320.

Because, as the display apparatus has higher resolution, the connecting lines of the connecting portion 120 are formed more finely, and a contact area between the connecting line and the first ACF film 310 gets smaller, the likelihood of an electrical contact failure increases. Here, if the conductive ball 312 of the first ACF films 310 are small enough and uniformly arranged, and the thickness of the resin film is equal to or smaller than the diameter of the conductive ball 312, then the electrical contact failure may be prevented.

The non-random array anisotropic conductive film may be prepared in various ways. For example, after forming a plurality of micro-cavities on a film using a laser interference lithography, conductive ball may be uniformly arranged in the micro-cavities, and then the non-random array anisotropic conductive film may be formed by coating or laminating process. In addition, the non-random array anisotropic conductive film may be formed using other known methods.

The conductive paste part 320 may be disposed on the first ACF film 310. The conductive paste part 320 may include conductive paste. For example, the conductive paste part 320 may include metal such as silver (Ag), copper (Cu), etc. The conductive paste part 320 may include a plurality of conductive paste lines. The conductive paste lines may be formed corresponding to the connecting lines of the connecting portion 120, respectively. The conductive paste lines may be spaced apart from each other in the second direction D2. Thus, the conductive paste lines may be arranged along extending direction of the side surface of the display panel.

The conductive paste part 320 may be formed by forming an conductive paste directly on the side surface of the display panel by an inkjet method or by applying an conductive paste on the side surface of the display panel, and then patterning the conductive paste by patterning process such as a laser patterning method, but it is not limited thereto and the conductive paste part 320 can be formed by various known methods.

The second ACF film 330 may be an anisotropic conductive film. Thus, the second ACF film 330 may have a structure including a resin film having adhesive in which a plurality of conductive balls 332 are disposed. The conductive ball 332 may have a structure that metal particles such as nickel (Ni) and gold (Au) are coated on a surface of a polymer particle. The resin film may include thermosetting resin or thermoplastic resin.

The second ACF film 330 does not need to use a non-randomly arranged anisotropic conductive film, unlike the first ACF film 310. A generally used anisotropic conductive film can be used for the second ACF film 330. After attaching the second ACF film 330 on the conductive paste part 320, and the second ACF film 330 may then be pressed by the flexible circuit board 400 attached on the second ACF film 330 so that electrical contact characteristics between the conductive paste part 320, the second ACF film 330, and the flexible circuit board 400 can be improved to prevent an electrical contact failure.

The base film 410 of the flexible circuit board 400 may be a flexible film. The conductive pattern 420 of the flexible circuit board 400 may be formed to correspond to the conductive paste lines on the base film 410.

According to the exemplary embodiment, a display apparatus includes a display panel and a flexible circuit board on a side surface of the display panel including a driving circuit part for driving the display apparatus. The flexible circuit board is attached on the side surface using a first ACF film, a conductive paste part, and a second ACF film. Thus, display apparatus having a slim bezel in a non-display region can be implemented. In addition, the flexible circuit board is attached using the first ACF film, the conductive paste part, and the second ACF film, so that electrical contact failure can be prevented.

Although the display apparatus is a liquid crystal display apparatus in the present exemplary embodiment, it is not limited thereto. For example, the display apparatus may be an organic light emitting display apparatus, and the lower substrate may have an organic light emitting structure.

In addition, although the connecting portion 120 is included in the gate pattern in the present exemplary embodiment, the connecting portion 120 may be included in the data pattern instead of the gate pattern.

Figure 5:
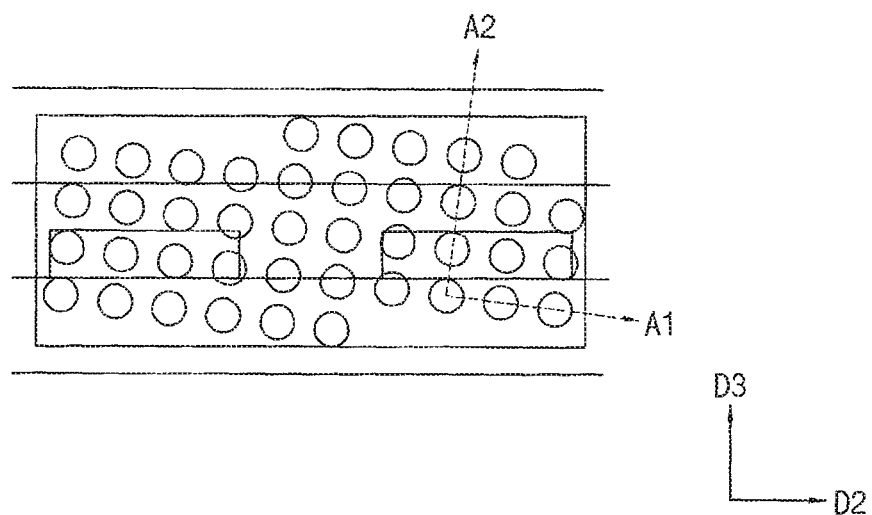
FIG. 5 is a side view illustrating a first ACF film of a display apparatus according to an exemplary embodiment, from the view of the first ACF film to a direction that is opposite to the direction D1, without illustrating intervening elements.

FIG. 5 is a side view illustrating a first ACF film of a display apparatus according to an exemplary embodiment.

Referring to FIG. 5, the display apparatus may be substantially the same as the display apparatus of FIGS. 1 to 4C, except for arrangement direction of conductive balls of a first ACF film. Thus, any further detailed descriptions concerning the same elements will be omitted.

The first ACF film may include a resin film and a plurality of conductive balls which are arranged in one layer in a matrix form in the resin film. The conductive balls may be arranged in the matrix form in a first inclined direction A1 which is inclined with respect to a second direction D2 and in a second inclined direction A2 which is inclined with respect to a third direction D3.

Thus, the conductive balls of the first ACF film may be arranged in the matrix form in a direction inclined at a predetermined angle with the second direction D2 in which the side of the display panel extends, unlike that of FIGS. 1 to 4. For example, the first inclined direction A1 may be inclined by about 15 degrees with the second direction D2, and the second inclined direction A2 may be perpendicular to the first inclined direction A1.

When the conductive balls are arranged obliquely, electrical contact characteristics between the conductive balls and the connection portion may not be deteriorated even if alignment of the first ACF film and the connection portion (see 120 in FIGS. 2 to 4) is somewhat inappropriate.

Figure 6:
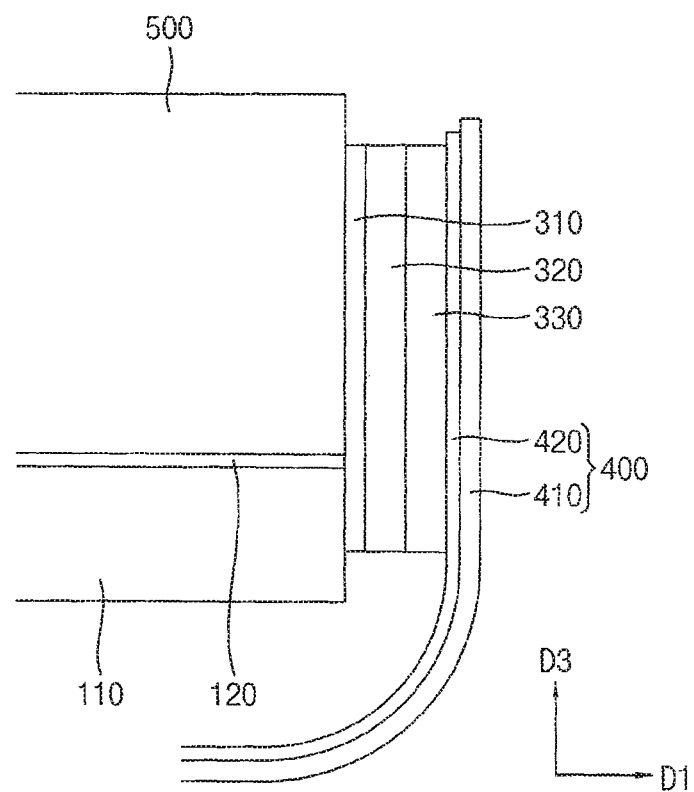
FIG. 6 is a cross-sectional view illustrating a peripheral region of a display apparatus according to an exemplary embodiment.
Figure 7:
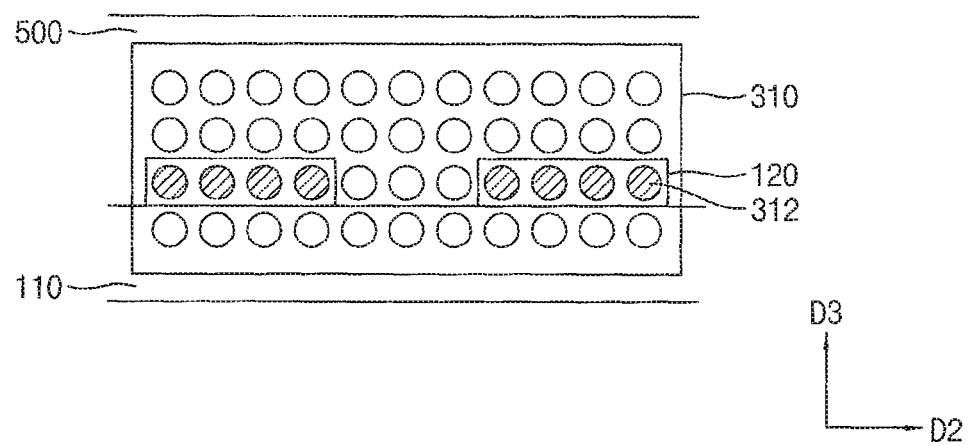
FIG. 7 is a side view illustrating a first ACF film of the display apparatus of FIG. 6, from the view of the first ACF film to a direction that is opposite to the direction D1, without illustrating intervening elements.

FIG. 6 is a cross-sectional view illustrating a peripheral region of a display apparatus according to an exemplary embodiment. FIG. 7 is a side view illustrating a first ACF film of the display apparatus of FIG. 6.

Referring to FIGS. 6 and 7, the display apparatus may be substantially the same as the display apparatus of FIGS. 1 to 4, except for a cover layer 500. Thus, any further detailed descriptions concerning the same elements will be omitted.

The display apparatus may include a display panel, a first ACF film 310, a conductive paste part 320, a second ACF film 330, and a flexible circuit board 400 in a peripheral region. The display panel may include a lower base substrate 110, a connecting portion 120, and a cover layer 500. The flexible circuit board 400 may include a conductive pattern 420 and a base film 410.

The display panel may be an organic light emitting display panel including an organic light emitting structure. The cover layer 500 may include an insulation material. For example, the cover layer 500 may be a sealing substrate. When the cover layer 500 is the sealing substrate, the sealing substrate may be a glass substrate, a quartz substrate, a transparent resin substrate, etc.

The first ACF film 310 may include a plurality of conductive balls 312, and may make contact with the lower base substrate 110, the connecting portion 120, and the cover layer 500.

Figure 8:
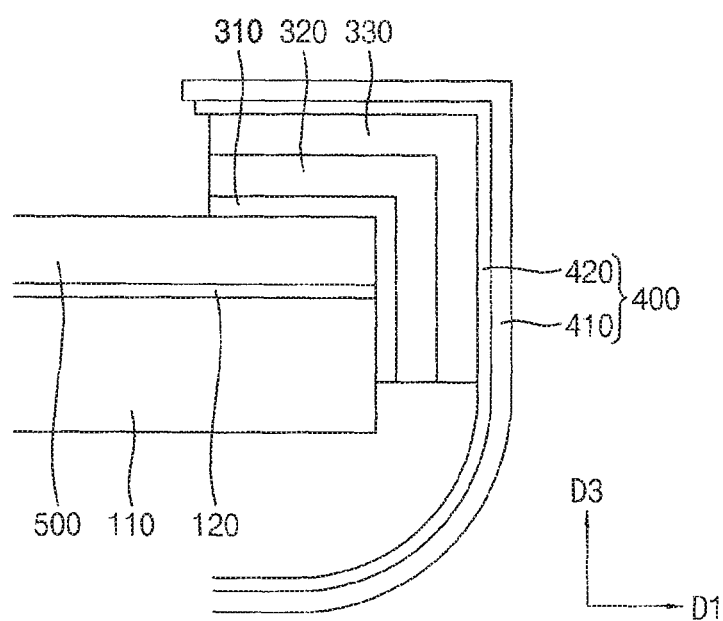
FIG. 8 is a cross-sectional view illustrating a peripheral region of a display apparatus according to an exemplary embodiment.

FIG. 8 is a cross-sectional view illustrating a peripheral region of a display apparatus according to an exemplary embodiment. The display apparatus may be substantially the same as the display apparatus of FIG. 6, except that a cover layer 500 is a thin film encapsulation layer. Thus, any further detailed descriptions concerning the same elements will be omitted.

The cover layer 500 may be a thin film encapsulation layer. The thin film encapsulation layer may include an inorganic film such as silicon oxide or silicon nitride film and an organic film such as epoxy or polyimide film which are alternately repeatedly formed. However, exemplary of embodiments of thin film encapsulation layer may not be limited thereto, any structure of transparent thin film for sealing may be applied. In addition, stacking order of the inorganic film and the organic film may be changed if necessary.

The thin film encapsulation layer has relatively smaller thickness than a glass substrate, so that a first ACF film 310, a conductive paste part 320, a second ACF film 330, and a flexible circuit board 400 may be bent and attached on the cover layer 500, a connecting part 120, and the lower base substrate 110. For example, as shown in the figure, the first ACF film 310 may be attached on upper and side surfaces of the cover layer 500, the connecting portion 120, and a side surface of the lower base substrate 110. Although not shown in the figure, in some exemplary embodiments, the first ACF film 310 may be attached on the side surface of the cover layer 500, the connecting portion 120, and the side surface and a lower surface of the lower base substrate 110. In addition, the first ACF film 310 may be attached on the upper and side surfaces of the cover layer 500, the connecting portion 120, and the side and lower surfaces of the lower base substrate 110 so that the first ACF film 310 is attached on the side, upper, and lower surface of the display panel with having c-shape.

Figure 9:
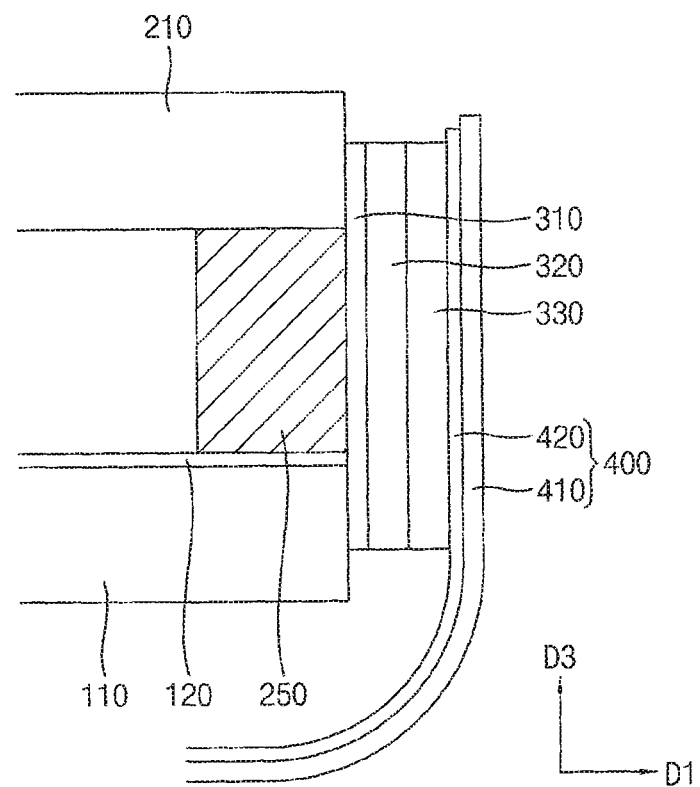
FIG. 9 is a cross-sectional view illustrating a peripheral region of a display apparatus according to an exemplary embodiment.
Figure 10:
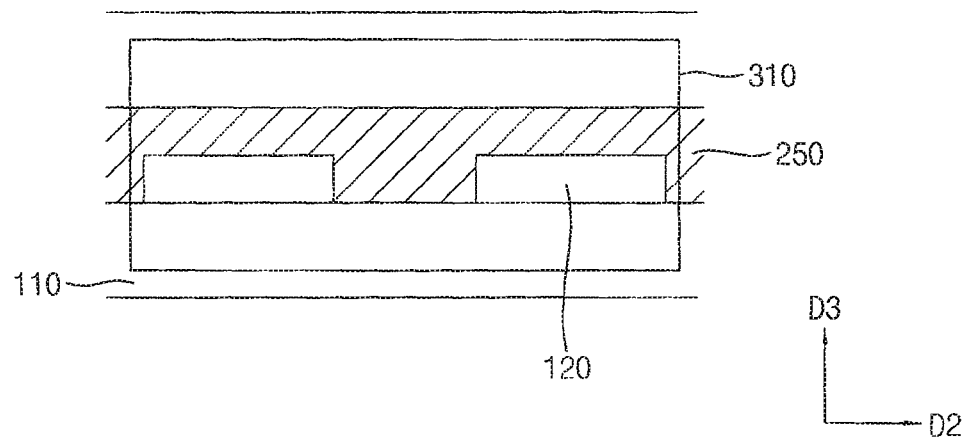
FIG. 10 is a side view illustrating a first ACF film of the display apparatus of FIG. 9, from the view of the first ACF film to a direction that is opposite to the direction D1 without illustrating intervening elements.

FIG. 9 is a cross-sectional view illustrating a peripheral region of a display apparatus according to an exemplary embodiment. FIG. 10 is a side view illustrating a first ACF film of the display apparatus of FIG. 9.

Referring to FIGS. 9 and 10, the display apparatus may be substantially the same as the display apparatus of FIGS. 1 to 4, except that a sealing member 250 makes contact with a first ACF film 310. Thus, any further detailed descriptions concerning the same elements will be omitted.

The display apparatus may include a display panel, a first ACF film 310, a conductive paste part 320, a second ACF film 330, and a flexible circuit board 400 in a peripheral region. The display panel may include a lower base substrate 110, a connecting portion 120, and a sealing member 250. The flexible circuit board 400 may include a conductive pattern 420 and a base film 410.

The first ACF film 310 may make contact with the lower base substrate 110, the connecting portion 120, the sealing member 250, and the upper base substrate 210.

Figure 11:
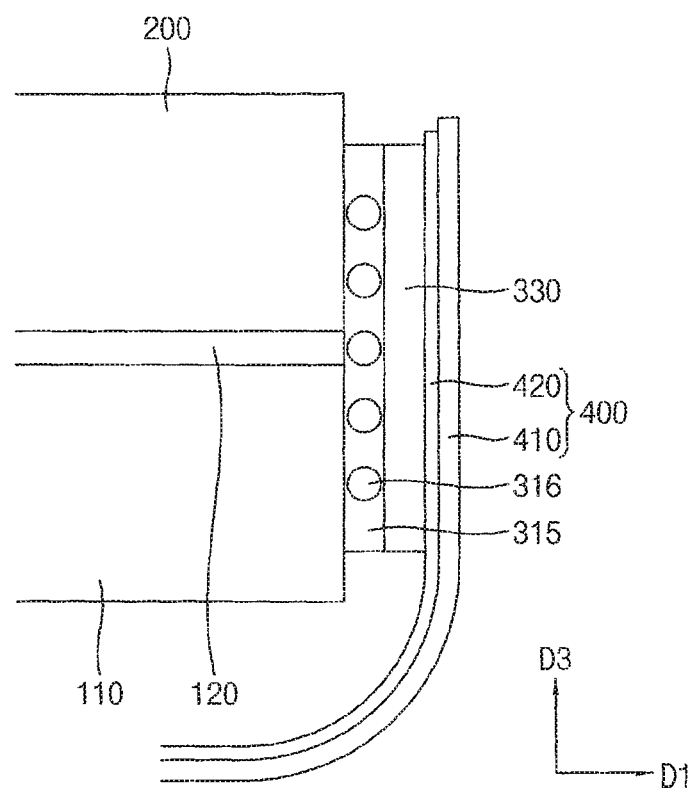
FIG. 11 is a cross-sectional view illustrating a peripheral region of a display apparatus according to an exemplary embodiment.
Figure 12:
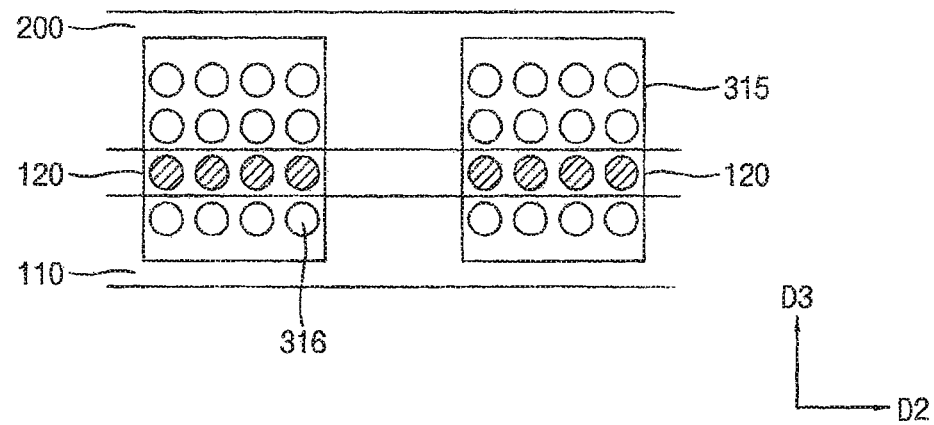
FIG. 12 is a side view illustrating a conductive pattern of the display apparatus of FIG. 11, from the view of the conductive paste part to a direction that is opposite to the direction D1, without illustrating intervening elements.

FIG. 11 is a cross-sectional view illustrating a peripheral region of a display apparatus according to an exemplary embodiment. FIG. 12 is a side view illustrating a conductive pattern of the display apparatus of FIG. 11.

Referring to FIGS. 11 and 12, the display apparatus may be substantially the same as the display apparatuses explained above, except that a conductive paste part 315 further includes a conductive ball 316. Thus, any further detailed descriptions concerning the same elements will be omitted.

The display apparatus may include a display panel, a conductive paste part 315, a second ACF film 330, and a flexible circuit board 400 in a peripheral region. The display panel may include a lower base substrate 110, a connecting portion 120, and an upper substrate 200. The flexible circuit board 400 may include a conductive pattern 420 and a base film 410.

The conductive paste part 315 may include conductive paste. For example, the conductive paste part 315 may include metal such as silver (Ag), copper (Cu), etc. The conductive paste part 315 may include a plurality of conductive paste lines. The conductive paste lines may be formed corresponding to the connecting lines of the connecting portion 120, respectively. The conductive paste lines may be spaced apart from each other in a second direction D2. Thus, the conductive paste lines may be arranged along extending direction of the side surface of the display panel.

The conductive paste part 315 may include a plurality of conductive balls 316. The conductive ball 316 may have a structure that metal particles such as nickel (Ni) and gold (Au) are coated on a surface of a polymer particle. In some exemplary embodiments, the conductive paste part 315 may further include solder balls. In this case, when the conductive paste part 315 is attached on the side surface of the display panel, the solder balls may be heated and soldered to the connecting portion 120 for attachment.

The conductive paste part 315 may be directly attached on the side surface of the display panel. Thus, the conductive paste part 315 may make contact with the lower base substrate 110, the connecting portion 120, and the upper substrate 200.

According to the present exemplary embodiment, the display apparatus includes a plurality of conductive balls or solder balls, so that the flexible circuit board 400 can be firmly attached on the side surface of the display panel without any problem of electrical contact failure.

FIGS. 13A to 13I are cross-sectional views and side views of a peripheral region of the display apparatus of FIG. 1.

Figure 13A:
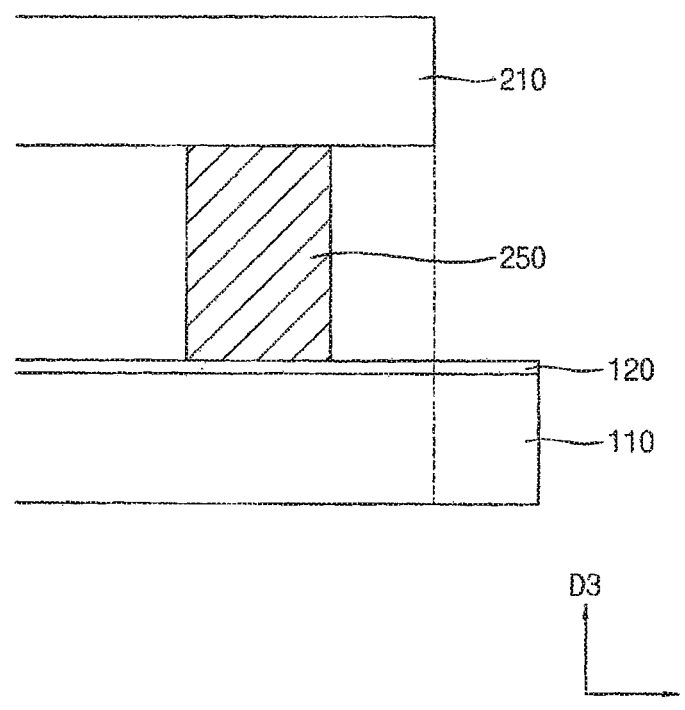
FIG. 13A, FIG. 13B, FIG. 13C, FIG. 13D, FIG. 13E, FIG. 13F, FIG. 13G, FIG. 13H, and FIG. 13I are cross-sectional views and side views of a peripheral region of the display apparatus of FIG. 1.

Referring to FIG. 13A, a display panel including a lower substrate and an upper substrate may be provided. The display panel may be manufactured by a traditional manufacturing method. The display panel may include a lower base substrate 110, a connecting part 120, an upper base substrate 210, and a sealing member 250.

A portion of the lower base substrate 110 and a portion of the connecting portion 120 which are protruded from a side surface of the display panel may be cut (dotted line in FIG. 13A). Accordingly, the side surface of the display panel which has been cut may have a flat surface for easy attachment of the first ACF film (see, e.g., 310 of FIG. 13B).

Figure 13B:
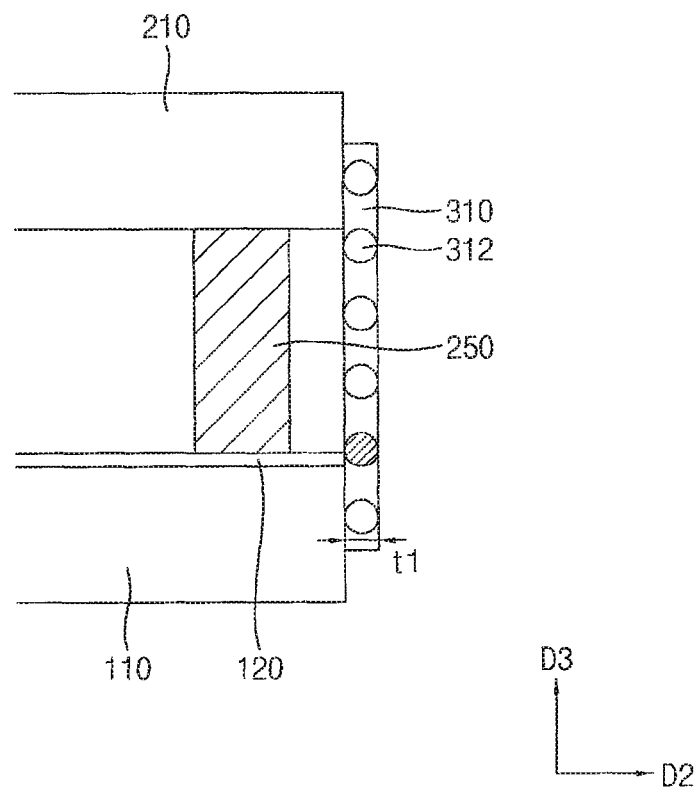
Figure 13C:
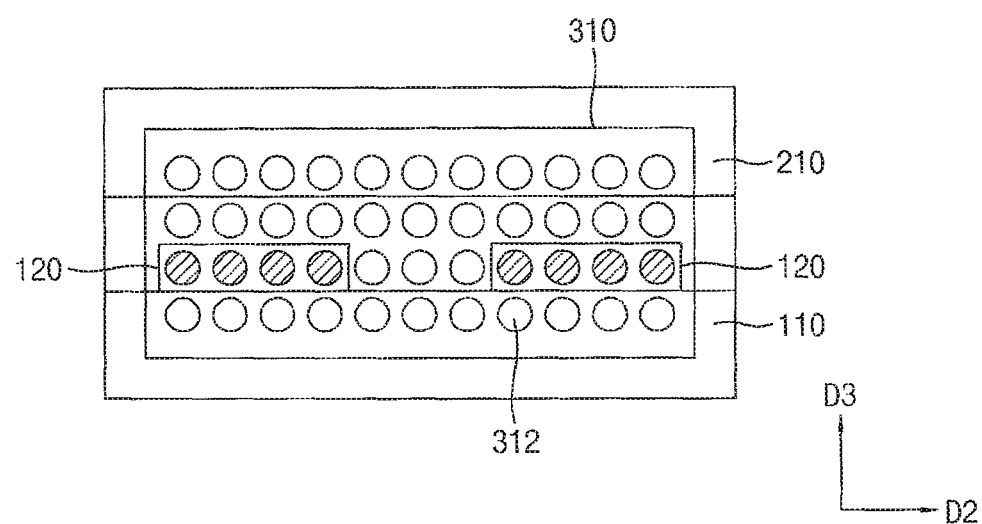

Referring to FIGS. 13B and 13C, a first ACF film 310 may be attached on a side surface of the lower base substrate 110, the end of the connecting portion 120, and a side surface of the upper base substrate 210. The first ACF film 310 may be an anisotropic conductive film having a structure including a resin film in which a plurality of conductive balls 312 are disposed. Preferably, the first ACF film 310 may be a non-random array anisotropic conductive film. For example, the first ACF film 310 may have a structure including a resin film having adhesive in which a plurality of conductive balls 312 are arranged in one layer. Here, a thickness t1 of the resin film of the first ACF film 310 may be preferably the same as or smaller than a diameter of the conductive balls 312.

Figure 13D:
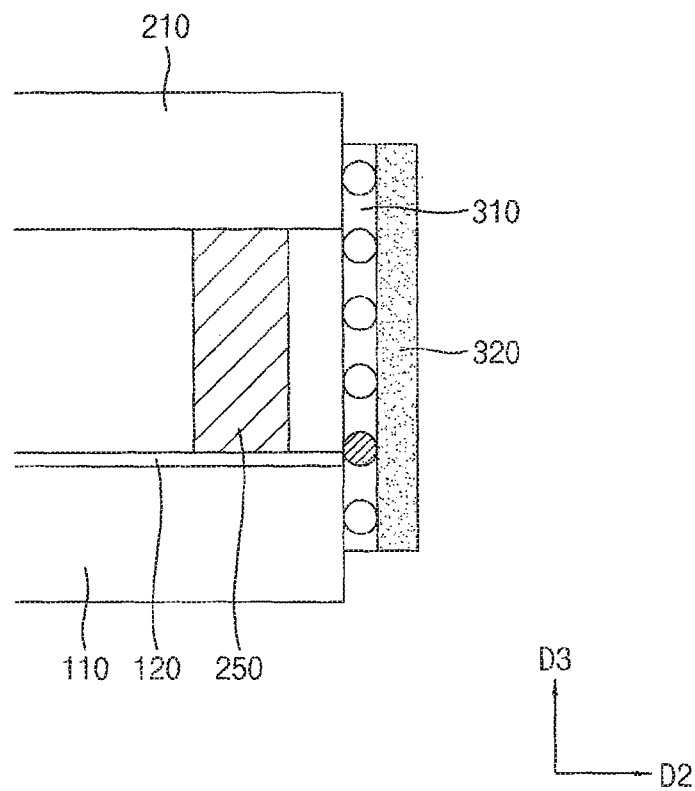
Figure 13E:
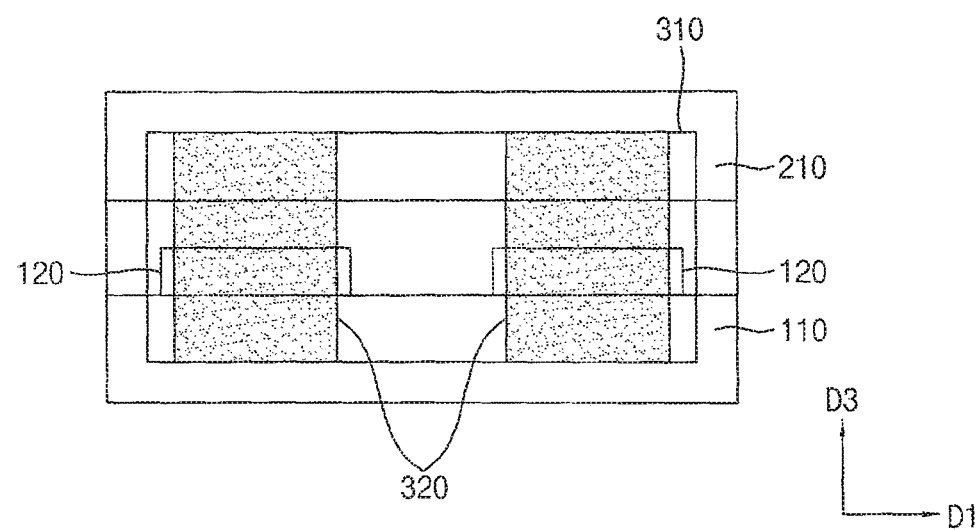

Referring to FIGS. 13D and 13E, a conductive paste 320 may be formed on the first ACF film 310 attached on the side surface of the display panel. The conductive paste part 320 may be formed by coating a conductive paste on the first ACF film 310 and patterning the conductive paste by patterning process such as a laser patterning method, but it is not limited thereto and the conductive paste part 320 can be formed by various known methods.

Figure 13F:
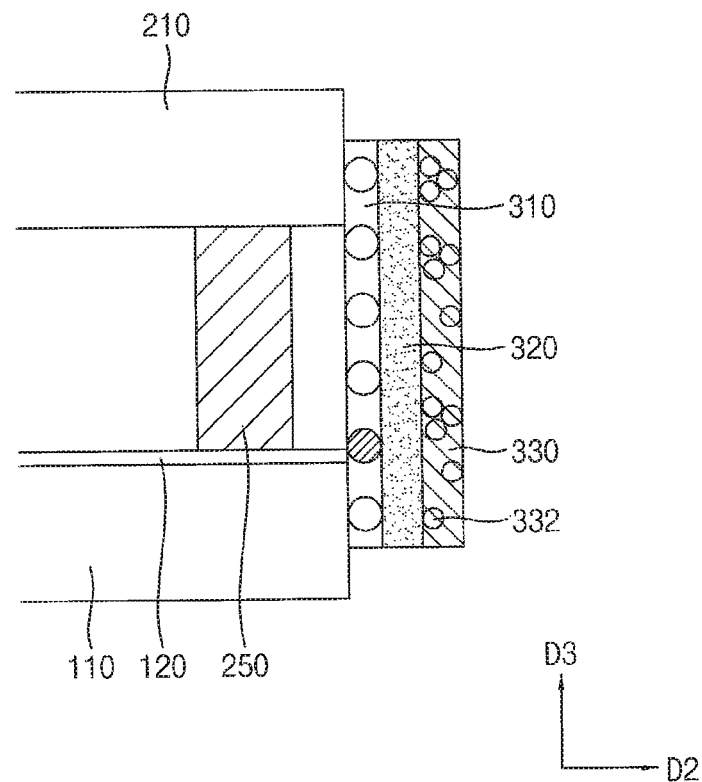
Figure 13G:
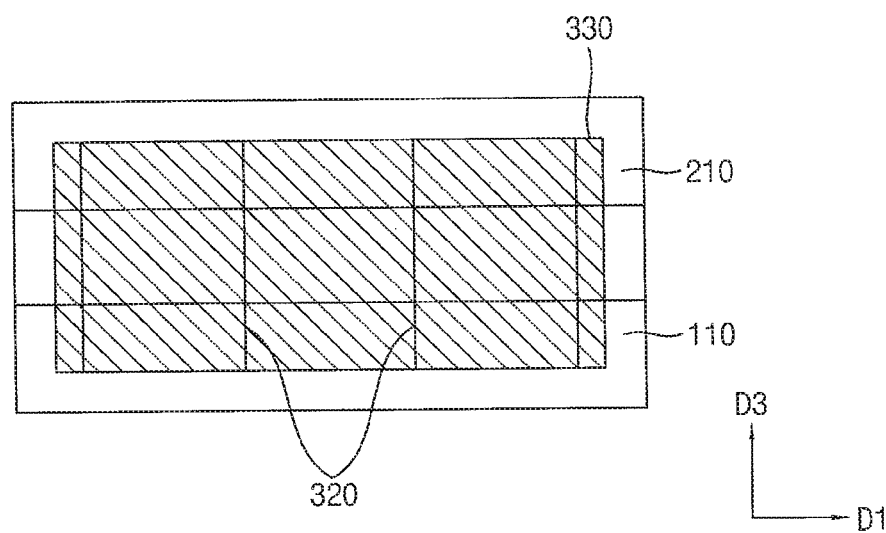

Referring to FIGS. 13F and 13G, a second ACF film 330 may be attached on the conductive paste part 320. The second ACF film 330 does not need to use a non-randomly arranged anisotropic conductive film, unlike the first ACF film 310. A generally used anisotropic conductive film having a plurality of conductive balls 332 can be used for the second ACF film 330.

Figure 13H:
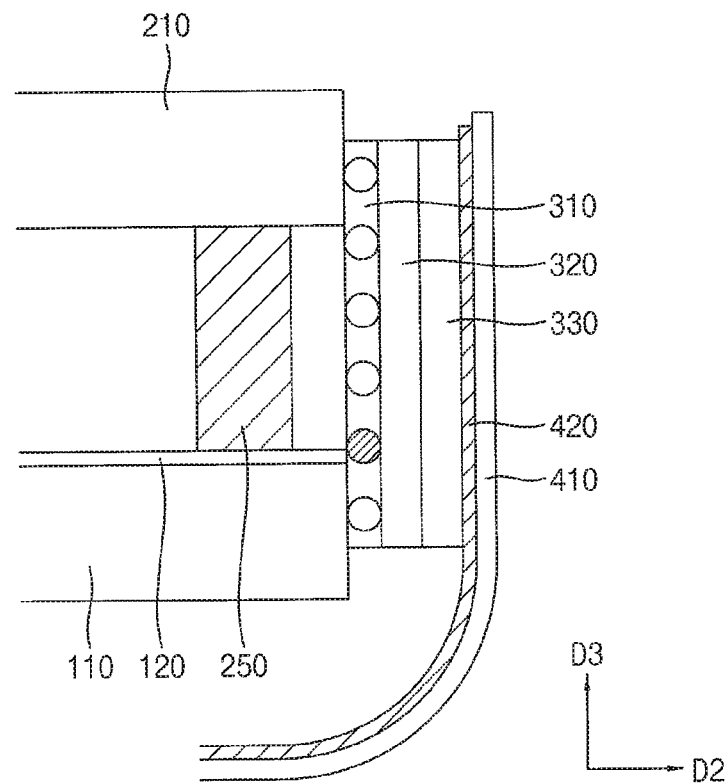
Figure 13I:
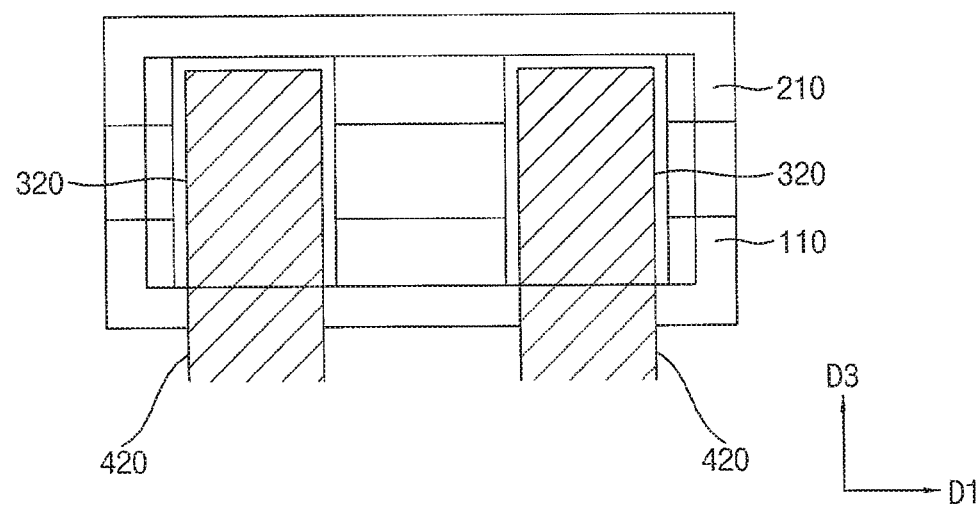

Referring to FIGS. 13H and 13I, a flexible circuit board 400 including a base film 410 and a conductive pattern 420 formed on the base film 410 may be attached on the second ACF film 330. The conductive pattern 420 may be located to make contact with the second ACF film 330, and then the flexible circuit board 400 may be pressed toward the display panel, so that the flexible circuit board 400 may be attached on the second ACF film 330. Accordingly, the display apparatus may be manufactured.

Figure 14A:
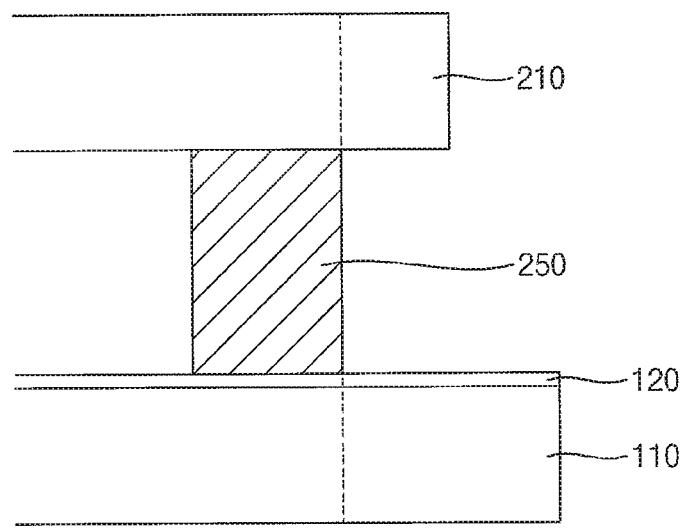
FIG. 14A and FIG. 14B are cross-sectional views and side views of a peripheral region of the display apparatus of FIG. 9.
Figure 14A:
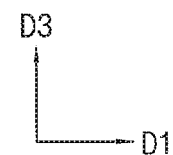
Figure 14B:
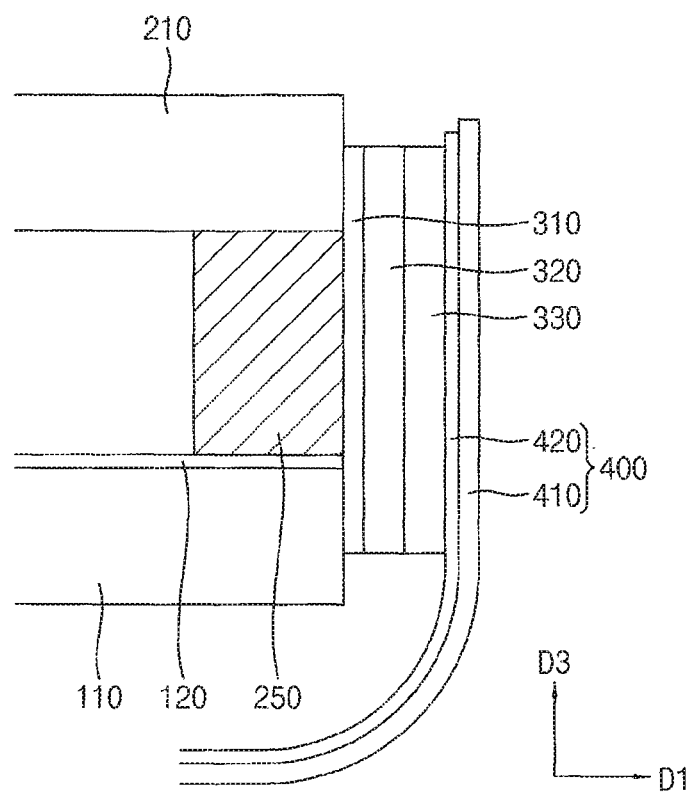

FIGS. 14A and 14B are side view and cross-sectional view of a peripheral region of the display apparatus of FIG. 9.

Referring to FIG. 14A, a display panel including a lower base substrate and an upper substrate may be provided. The display panel may be manufactured by a traditional manufacturing method. The display panel may include a lower base substrate 110, a connecting part 120, an upper base substrate 210, and a sealing member 250.

A portion of the lower base substrate 110 and a portion of the connecting portion 120 which are protruded from a side surface of the display panel may be cut (dotted line in the figure), Accordingly, the side surface of the display panel which has been cut may have a flat surface for easy attachment of the first ACF film (refers to 310 of FIG. 14B). Here, a surface of the sealing member 250 may be disposed on a side surface of the lower base substrate 110 and a side surface of the upper base substrate 210 to form a flat surface for attaching the first ACF film.

Referring to FIG. 14B, a first ACF film 310, a conductive paste part 320, a second ACF film 330 and a flexible circuit board 400 including a base film 410 and a conductive pattern 420 formed on the base film 410 may be attached on the side surface of the display panel. The first ACF film 310, the conductive paste part 320, the second ACF film 330, and the flexible circuit board 400 may be formed by same way explained in FIGS. 13B to 13I. Accordingly, the display apparatus may be manufactured.

FIGS. 15A to 15F are cross-sectional views and side views of a peripheral region of the display apparatus of FIG. 1.

Figure 15A:
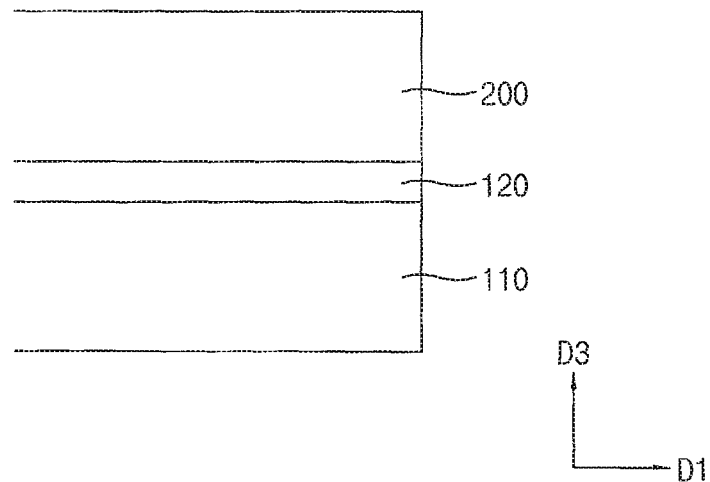
Figure 15C:
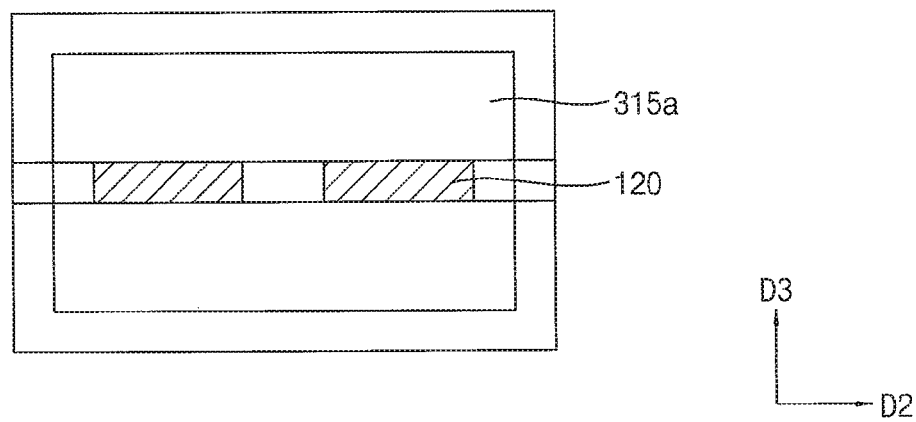
Figure 15D:
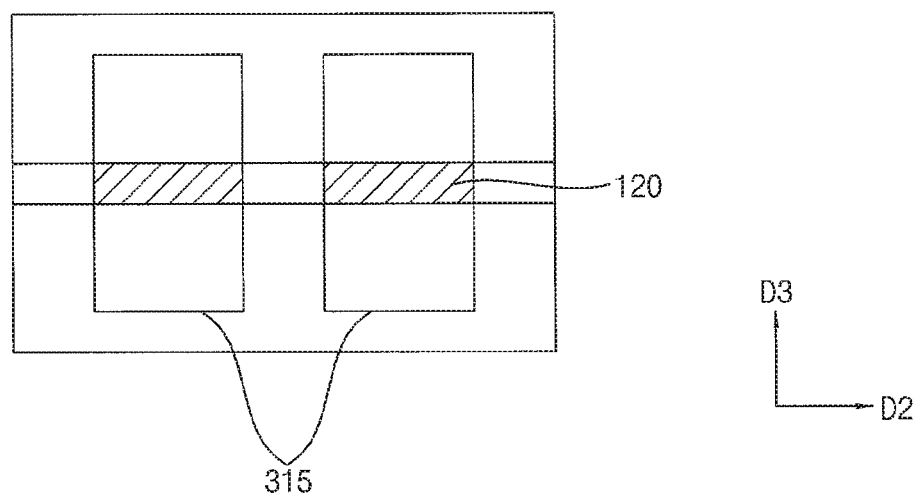

Referring to FIG. 15A, a display panel including a lower substrate and an upper substrate may be provided. The lower substrate may include a lower base substrate 110 and a connecting part 120. The display panel may be manufactured by a traditional manufacturing method.

Figure 15E:
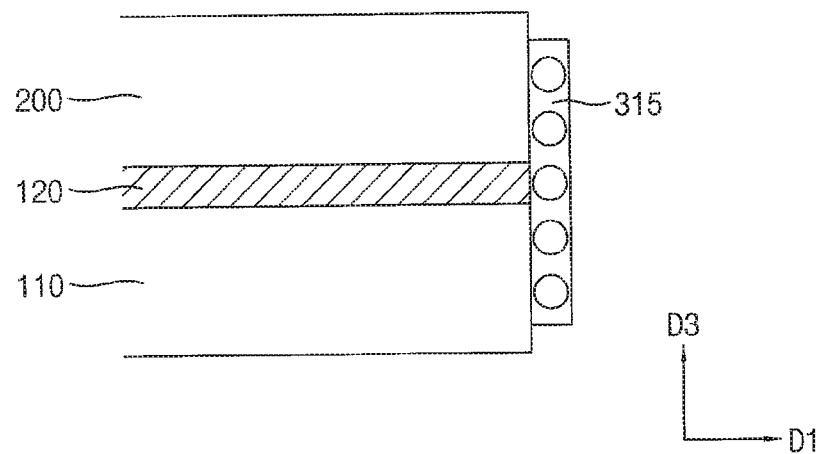

Referring to FIGS. 15B and 15E, a conductive paste part 315 may be formed on a side surface of the display panel.

A conductive paste 22 with conductive balls 316 which is applied on a substrate 20 may be imprinted using a silicon pad 10 by stamping method to form the conductive paste part 315. Thus, a conductive paste layer 315a including the conductive balls 316 may be formed on the silicon pad 10 by a stamping method (see FIG. 15B). And then, the conductive paste layer 315a may be imprinted on the side surface of the display panel (see FIG. 15C). The conductive paste part 315 may then be formed by patterning the conductive paste layer 315a on the side surface of the display panel by patterning process such as a laser patterning method (see FIGS. 15D to 15E). The conductive paste part 315 may include a plurality of conductive paste lines spaced apart from each other in an extension direction of the side surface of the display panel.

Figure 15F:
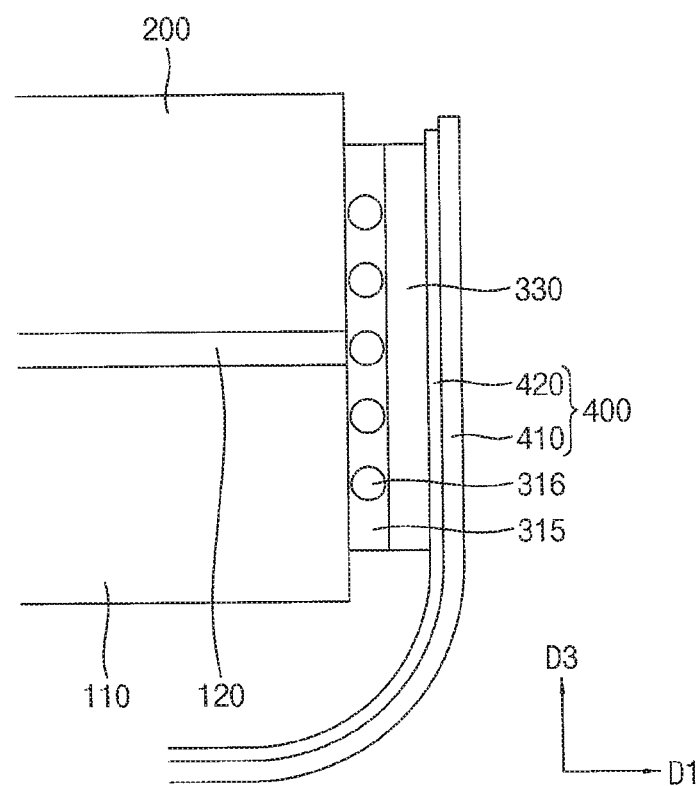

Referring to FIG. 15F, a second ACF film 330 and a flexible circuit board 400, including a base film 410 and a conductive pattern 420 formed on the base film 410, may be attached on the conductive paste part 315. The second ACF film 330 and the flexible circuit board 400 may be formed by same way explained in FIGS. 13F to 13I. Accordingly, the display apparatus may be manufactured.

According to the exemplary embodiment, a display apparatus includes a display panel and a flexible circuit board on a side surface of the display panel including a driving circuit part for driving the display apparatus. The flexible circuit board is attached on the side surface using a first ACF film, a conductive paste part, and a second ACF film. Thus, display apparatus having a slim bezel which is non-display region can be implemented. In addition, the flexible circuit board is attached using the first ACF film, the conductive paste part, and the second ACF film, so that electrical contact failure can be prevented.

In addition, when the conductive balls are arranged obliquely, electrical contact characteristics between the conductive balls and the connection portion may not be deteriorated even if alignment of the first ACF film and the connection portion is somewhat inappropriate.

In addition, the display apparatus may further include a plurality of conductive balls or solder balls, so that the flexible circuit board 400 can be firmly attached on the side surface of the display panel without any problem of electrical contact failure.

The foregoing is illustrative of the inventive concepts and is not to be construed as limiting thereof. Although a few exemplary embodiments of the inventive concepts have been described, those skilled in the art will readily appreciate that many modifications are possible in the exemplary embodiments without materially departing from the novel teachings and advantages of the inventive concepts. Accordingly, all such modifications are intended to be included within the scope of the inventive concepts as defined in the claims. In the claims, means-plus-function clauses are intended to cover the structures described herein as performing the recited function and not only structural equivalents but also equivalent structures. Therefore, it is to be understood that the foregoing is illustrative of the inventive concepts and is not to be construed as limited to the specific exemplary embodiments disclosed, and that modifications to the disclosed exemplary embodiments, as well as other exemplary embodiments, are intended to be included within the scope of the appended claims.

Accordingly, the inventive concept is not limited to such embodiments, but rather to the broader scope of the presented claims and various obvious modifications and equivalent arrangements. The inventive concept is defined by the following claims, with equivalents of the claims to be included therein.

What is claimed is:

1. A display apparatus, comprising:
   a display panel comprising a lower base substrate and a connecting portion disposed on the lower base substrate;
   a flexible circuit board comprising a base film and a conductive pattern disposed on the base film, wherein the flexible circuit board is attached on a side surface of the display panel;
   a conductive paste part disposed between the side surface of the display panel and the flexible circuit board; and
   an anisotropic conductive film film disposed between the conductive paste part and the flexible circuit board,
   wherein the conductive paste part makes contact with the connecting portion at the side surface of the display panel.

2. The display apparatus of claim 1, wherein the anisotropic conductive film further comprises a plurality of conductive balls, and each of the plurality of conductive balls comprises a polymer particle and metal coated on a surface of the polymer particle.

3. The display apparatus of claim 2, wherein the plurality of conductive balls are solder balls, and
   the solder balls are soldered to the connecting part by heat.

* * * * *